MAGNETIC AMPLIFIER CONVERTER AND LIMITER

Filed Sept. 30, 1954 2 Sheets-Sheet 1

INVENTORS
HERBERT W. KUNNES
FRANK J. ANTONAZZI
BY Herbert Smith
ATTORNEY

June 18, 1957 H. W. KUNNES ET AL 2,796,535

MAGNETIC AMPLIFIER CONVERTER AND LIMITER

Filed Sept. 30, 1954 2 Sheets-Sheet 2

INVENTORS
HERBERT W. KUNNES
FRANK J. ANTONAZZI

BY Herbert Smith
ATTORNEY 2,796,535

MAGNETIC AMPLIFIER CONVERTER AND LIMITER

Herbert W. Kunnes, Hackensack, N. J., and Frank J. Antonazzi, Bronx, N. Y., assignors to Bendix Aviation Corporation, Teterboro, N. J., a corporation of Delaware Application September 30, 1954, Serial No. 459,503

9 Claims. (Cl. 307—25)

This invention pertains to a magnetic amplifier and more particularly to a phase sensitive converter-limiter magnetic amplifier which may be used with servo systems.

Heretofore, when the converter or demodulator of a signal chain was of the diode type, there was always present an attenuation of the signal. When a converter or demodulator of the vacuum tube type was employed, it was power consuming, and, moreover, its bulk required relatively large installation space which was not always readily available in aircraft.

The present invention provides a compact magnetic amplifier demodulator which will work directly from any suitable low impedance signal source, such as a synchro.

It is an object of the present invention to provide a novel magnetic amplifier arrangement.

A further object of the invention is to provide a novel magnetic amplifier converter-limiter.

Another object is the provision of a novel phase sensitive converter-limiter.

Another object of the invention is to provide a novel magnetic amplifier arrangement which will work directly from a synchro as a signal source, and which will be a combined converter and limiter.

Another object is to provide a novel magnetic amplifier that will be efficient and reliable, yet extremely robust.

The present invention contemplates a phase sensitive converter-limiter circuit employing a pair of saturable reactors connected between the output windings of a center tap reference transformer and a center tap power transformer, both of said transformers having a source of excitation impressed thereon. The input signal source is impressed between the center tap of the reference transformer and a center tap of the control winding of the saturable reactor, while the output is connected across the center tap of the power transformer and a center tap of the power windings of the saturable reactor.

A second form of the invention eliminates the center tap reference transformer and its source of excitation. In this latter arrangement, a pair of rectifiers are connected with their polarities aiding and this connection is one terminal of the signal input, and the other terminal of the signal input is the mid-tap of the control winding of the saturable reactor.

The foregoing and other objects and advantages of the invention will appear more fully hereinafter from a consideration of the detailed description which follows, taken together with the accompanying drawings wherein two embodiments of the invention are illustrated by way of example. It is to be expressly understood, however, that the drawings are for illustration purposes only and are not to be construed as defining the limits of the invention.

Figure 6:
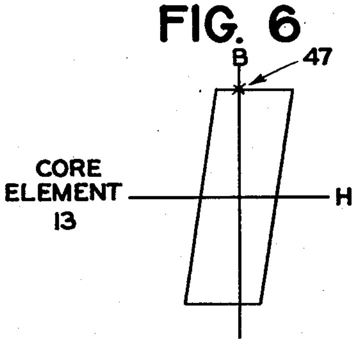
Figure 7:
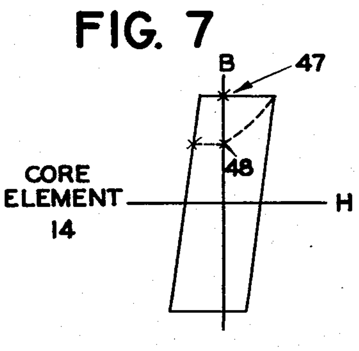

Figs. 6 and 7 B-H curves for certain conditions of the second form of the invention.

Figure 8:
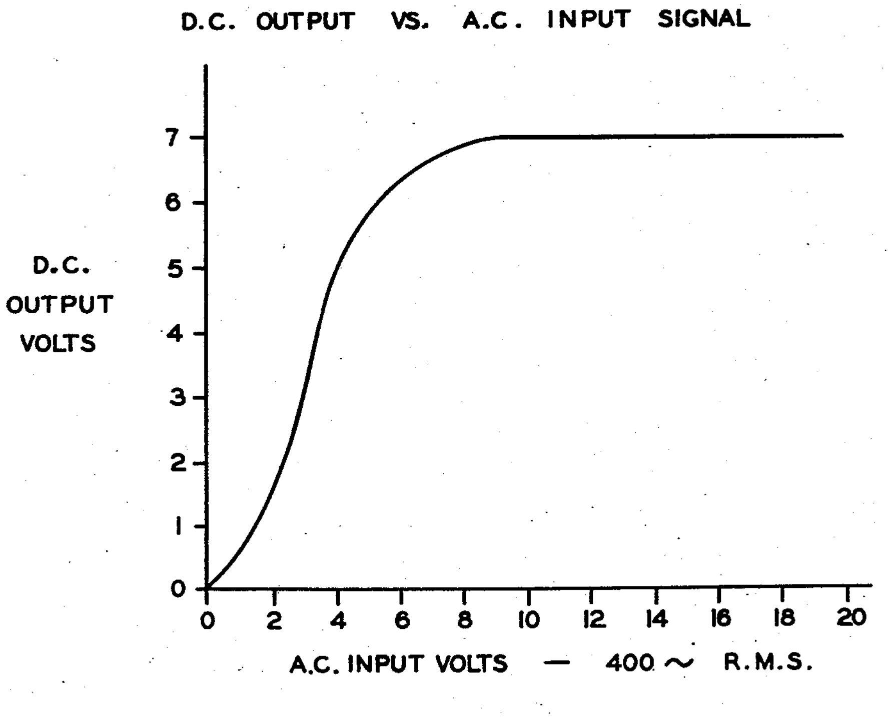

Fig. 8 is a curve showing the direct current output versus the signal input for the arrangement shown in the second form of the invention.

Figure 1:
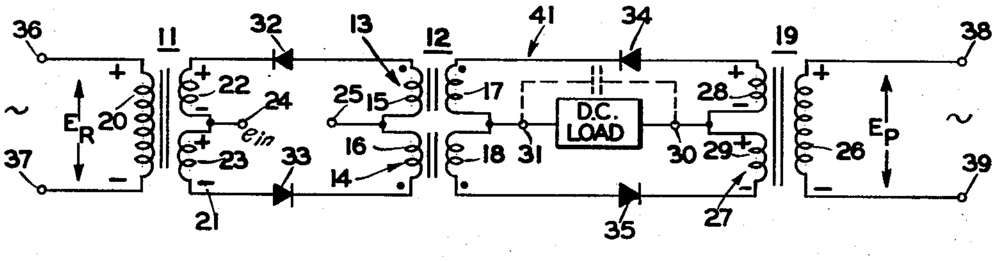
Fig. 1 is a schematic diagram of one form of the invention.

Referring to the drawings, and more particularly to Fig. 1, there is shown a magnetic amplifier 12 having a pair of saturable reactors 13 and 14, having signal or control windings 15 and 16 respectively, and power windings 17 and 18 respectively wound on high permeable cores of magnetizable material. The magnetic amplifier is connected intermediate a reference transformer 11 and a power transformer 19. The reference transformer 11 has an input winding 20, and a secondary winding 21 having portions 22 and 23, with a mid-point or center tap therebetween connected to an input terminal 24. A second input terminal 25 is connected to a mid tap of the control windings 15 and 16 of the magnetic amplifier 12. The control windings of the magnetic amplifier are connected in series opposition. The power transformer has an input winding 26 and a center tapped secondary winding 27 having two portions 28 and 29. The center tap of said secondary winding 27 is connected to a load or output terminal 30. A second output terminal 31 is connected to a mid tap of the power windings 17 and 18, which windings are also connected in series opposition. The rectifiers 32 and 33 are connected with their polarities in aiding relationship to secondary winding 21 of reference transformer 11 and to control windings 15 and 16 of magnetic amplifier 12.

Rectifiers 34 and 35 are connected with their polarities in aiding relationship to the power windings 17 and 18 of the magnetic amplifier 12, and to secondary winding 27. The plus and minus indications shown on the drawings by the symbols + and − are for a particular instance of operation of the device. The reset voltage excitation of the reference transformer 11 is connected to the primary 20 thereof at terminals 36 and 37, and is shown on the drawings by symbol $E_R$. Power excitation is supplied to the input winding of the power transformer 19 across terminals 38 and 39 and is indicated in the drawings by the symbol $E_P$.

Figure 4:
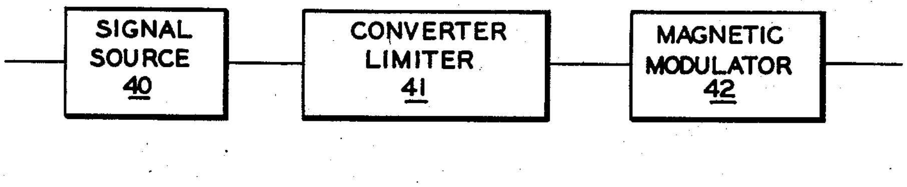
Fig. 4 is a block diagram of a signal chain employing the circuit shown in Fig. 1.

Fig. 4 of the drawings shows a block with the legend "signal source" 40 connected to a block with the legend converter-limiter 41 which in turn is connected to an output load shown as a block with the legend "Magnetic Modulator" 42. It is to be understood that the converter-limiter 41 includes the circuitry of Fig. 1 and also includes the reset voltage excitation connectable across terminals 36 and 37, and the power excitation connected across terminals 38 and 39 of Figure 1.

The system shown in Fig. 4 will present at its output a clean sine wave which has a linear transfer range, and a limit point which will be relatively insensitive to input phase changes. The converter limiter 41 will also reject quadrature completely.

The elements 13 and 14, in one form, are toroidal magnetic amplifiers wound on a type of core yielding a rectangular B-H loop with relatively narrow width along the H axis.

Referring to the polarities shown in the diagram in Fig. 1, the power transformer will cause current to flow through rectifiers 34 and 35. If the cores of elements 13 and 14 had been preset to the same magnetic level on the previous half cycle at a "no signal" condition, the cores of saturable reactors 13, 14 will be saturated and the impedance of the power windings 17 and 18 will remain the same. The output potential at terminals 30, 31 will be zero and no current will flow through the load.

In the next half cycle, all of the polarities indicated on the diagram will be reversed. If we assume a signal input $E_{in}$ is introduced at terminals 24 and 25, the reset current through control winding 15 will differ from that of control winding 16 on this same half cycle, and the magnetic level of the two cores of elements 13 and 14 will also differ accordingly. On the next half cycle, or power cycle, the polarities will be as indicated on the diagram of Fig. 1. At this time one core will be saturated before the other core and the impedances of the power windings of the two cores will be different for this interval during which current will flow through the load. The direction of this current flow will depend upon the instantaneous polarity of the input signal during the reset cycle, and, therefore, the circuit is phase sensitive.

Figure 2:
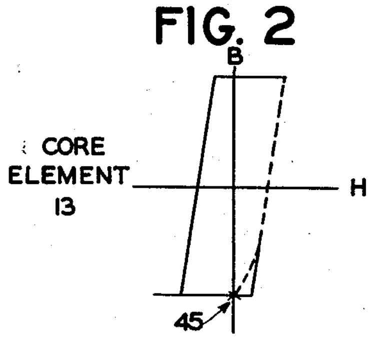
Figs. 2 and 3 are B-H curves for certain conditions of the circuit shown in Fig. 1.
Figure 3:
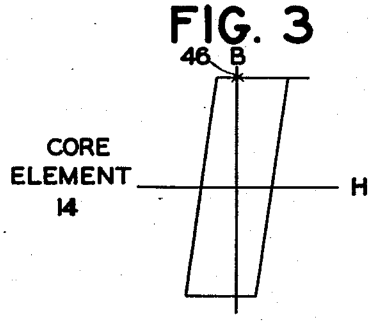

Maximum output will be obtained when the signal is large enough to alternately drive one core into positive saturation and drive the other core into negative saturation. At the beginning of the next power cycle the core in negative saturation will be less negatively magnetized on the B-H curve while the other core remains in saturation. This condition represents maximum output and no additional signal can increase this output. The B-H curves for this condition are illustrated in Figs. 2 and 3 and they show the case for core of reactor 13 being driven into negative saturation and left at point 45 at the end of the reset period. The core of element 14 will remain at point 46 during reset.

Figure 5:
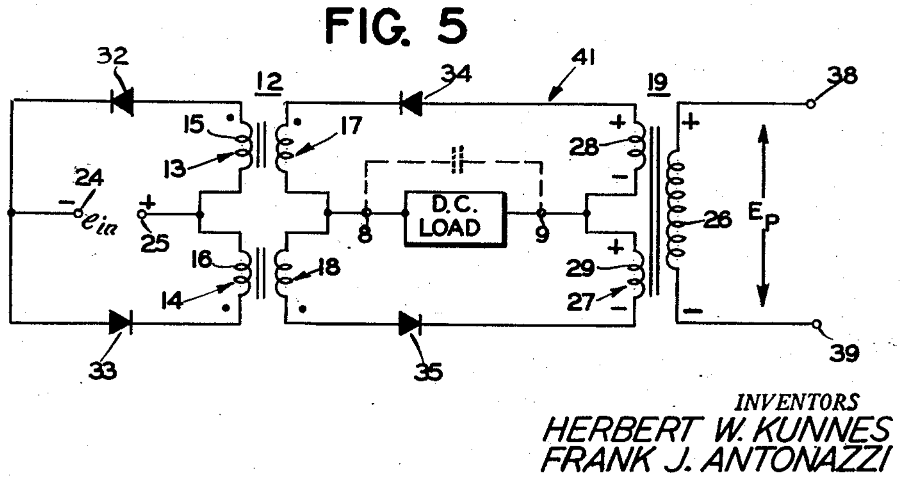
Fig. 5 is a schematic diagram of a second form which the invention may take.

Referring to Fig. 5, like parts with those shown in Fig. 1 have like reference numerals. It will be noted in Fig. 5 that the input terminal 24 is connected to a common connection or mid-point between the cathode of rectifier 32 and the plate of rectifier 33. In all other respects, the diagram is similar to that shown in Fig. 1. The dot shown in Figs. 1 and 5 adjacent one end of each of the control power windings is used as a conventional method of indicating that the windings are connected in series opposition.

In the diagram of Fig. 5, the arrangement of components are similar to comparable components for Fig. 1, but in Fig. 5 the center tap reference transformer has been eliminated, and the cathode of rectifier 32 is connected to the plate of rectifier 33 and the input terminal 24.

In the absence of a signal at terminals 24, 25 the saturation of both cores of reactors 13, 14 will be at the same point 47 on the B-H curves at the beginning of the power cycle. During the power cycle the polarities will be as indicated on the drawing of Fig. 5, and the impedance of windings 17 and 18 will be identical, and the potential at the output terminals 8 and 9 will be zero and no current will flow through the load.

When a signal of one polarity is introduced at terminals 24, 25 and the reset cycle begins, polarities across power transformer 19 are opposite to those shown in Fig. 5. The signal will then energize element 13 in such a manner as to reset its core to point 48, in Fig. 7. No current can flow through rectifier 32, and reactor 13 will remain saturated. At the beginning of the next power cycle the impedance of power winding 18 is no longer the same as that of power winding 17, and current will flow through the load until the core of reactor 14 is urged into saturation. The direction of current flow depends upon the instantaneous polarity of the input signal during the reset period. Therefore, the output is phase sensitive and consists of either positive or negative pulses.

Fig. 8 is a curve showing the D. C. output versus alternating voltage input of the circuit shown in Fig. 5. The curve shows a typical example of the output that would be obtained assuming a 1000 ohm resistive load across terminals 8, 9. This curve shows that the output is limited at 7 volts with a 10 volt input or any reasonable value thereabove.

While two embodiments of the invention have been illustrated and described in detail, it is to be expressly understood that the invention is not limited thereto. Various changes may also be made in the design and arrangement of the parts without departing from the spirit and scope of the invention as the same will now be understood by those skilled in the art.

What is claimed is:

1. A high speed magnetic amplifier having a pair of saturable reactors each having a high permeable core of magnetizable material and with a signal and a power winding thereon, said signal windings being connected in series opposition, said power windings being connected in series opposition, a source of reset voltage excitation, a rectifier connected between each side of said source of reset voltage excitation and said signal windings with the polarities of said rectifiers aiding, a source of power voltage excitation, a rectifier connected between each side of said source of power voltage excitation and said power windings with the polarities of said rectifiers aiding, input terminals provided at an electrical mid-point of said source of reset voltage excitation and an electrical mid-point of said signal windings, and output terminals provided at an electrical mid-point of said source of power voltage excitation and an electrical mid-point of said power windings.

2. A high speed magnetic amplifier having a pair of saturable reactors each having a high permeable core of magnetizable material and with signal and power windings thereon, said signal windings being connected in series opposition, said power windings being connected in series opposition, a source of reset voltage excitation, a rectifier connected between each side of said source of reset voltage excitation and said signal windings with the polarities of said rectifiers aiding, a source of power voltage excitation, a rectifier connected between each side of said source of power voltage excitation and said power windings with the polarities of said rectifiers aiding, input terminals provided at an electrical mid-point of said source of reset voltage excitation and an electrical mid-point of said signal windings, output terminals provided at an electrical mid-point of said source of power voltage excitation and an electrical mid-point of said power windings, and a modulated alternating voltage connected to said input terminals.

3. A high speed magnetic amplifier having a pair of saturable reactors each having a high permeable core of magnetizable material and with a signal and a power winding thereon, said signal windings being connected in series opposition, said power windings being connected in series opposition, a source of reset voltage excitation, a rectifier connected between each side of said source of reset voltage excitation and said signal windings with the polarities of said rectifiers aiding, a source of power voltage excitation, a rectifier connected between each side of said source of power voltage excitation and said power windings with the polarities of said rectifiers aiding, input terminals provided at an electrical mid-point of said source of reset voltage excitation and an electrical mid-point of said signal windings, output terminals provided at an electrical mid-point of said source of power voltage excitation and an electrical mid-point of said power windings, and a modulated alternating voltage connected to said input terminals whereby a pulsating unidirectional voltage will be supplied at the output terminals.

4. A high speed magnetic amplifier converter having a pair of saturable reactors each having a high permeable core of magnetizable material and with a signal and a power winding thereon, said signal windings being connected in series opposition, said power windings being connected in series opposition, a source of reset voltage excitation, a rectifier connected between each side of said source of reset voltage excitation and said signal windings with the polarities of said rectifiers aiding, a source of power voltage excitation, a rectifier connected between each side of said source of power voltage excitation and said power windings with the polarities of said rectifiers aiding, input terminals provided at an electrical mid-point of said source of reset voltage excitation and an electrical midpoint of said signal windings, output terminals provided at an electrical mid-point of said source of power voltage excitation and an electrical mid-point of said power windings, a source of signal connected to said input terminals, and a load connected to said output terminals, whereby when the magnitude of the input signal is such that one core is driven into negative saturation while the other core is prevented from resetting, maximum output is obtained.

5. A phase sensitive high speed magnetic amplifier having a pair of saturable reactors each having a high permeable core of magnetizable material and with a signal and a power winding thereon, said signal windings being connected in series opposition, said power windings being connected in series opposition, a source of reset voltage excitation, a rectifier connected between each side of said source of reset voltage excitation and said signal windings with the polarities of said rectifiers aiding, a source of power voltage excitation, a rectifier connected between each side of said source of power voltage excitation and said power windings with the polarities of said rectifiers aiding, input terminals connected to an electrical midpoint of said source of reset voltage excitation and an electrical midpoint of said signal windings, and output terminals connected between an electrical mid-point of said source of power voltage excitation and an electrical midpoint of said power windings, a load connected to the output terminals, and a signal source connected to the input terminals, whereby when the signal is of one phase the resultant output will be one polarity and when the signal is of the opposite phase the output polarity will be reversed.

6. A high speed magnetic amplifier having a pair of saturable reactors each having a high permeable core of magnetizable material and with a signal and a power winding thereon, said signal windings being connected in series opposition, said power windings being connected in series opposition, a source of power voltage excitation, a rectifier connected between each side of said source of power voltage excitation and said power windings with the polarities of said rectifiers aiding, a pair of rectifiers serially connected to said signal windings with the polarities of said rectifiers aiding and having an electrical midpoint, input terminals provided at said electrical mid-point of said pair of rectifiers and an electrical mid-point of said signal windings, and output terminals provided at an electrical mid-point of said source of power voltage excitation and an electrical mid-point of said power windings.

7. A high speed magnetic amplifier having a pair of saturable reactors each having a high permeable core of magnetizable material and with a signal and a power winding thereon, said signal windings being connected in series opposition, said power windings being connected in series opposition, a source of power voltage excitation, a rectifier connected between each side of said source of power voltage excitation and said power windings with the polarities of said rectifiers aiding, a pair of rectifiers serially connected to said signal windings with the polarities of said rectifiers aiding and having an electrical midpoint, input terminals provided at said electrical mid-point of said pair of rectifiers and an electrical mid-point of said signal windings, and output terminals provided at an electrical mid-point of said source of power voltage excitation and an electrical mid-point of said power windings, a load connected to the output terminals, and a signal source connected to the input terminals, whereby, when the signal is of one phase the resultant output will be one polarity, and when the signal is of the opposite phase the output polarity will be reversed.

8. A high speed magnetic amplifier having a pair of saturable reactors each having a higher permeable core of magnetizable material and with a signal and a power winding thereon, said signal windings being connected in series opposition, said power windings being connected in series opposition, a source of power voltage excitation, a rectifier connected between each side of said source of power voltage excitation and said power windings with the polarities of said rectifiers aiding, a pair of rectifiers serially connected to said signal windings with the polarities of said rectifiers aiding and having an electrical midpoint, input terminals provided at said electrical midpoint of said pair of rectifiers and an electrical mid-point of said signal windings, output terminals provided at an electrical mid-point of said source of power voltage excitation and an electrical mid-point of said power windings, a source of signal connected to said input terminals, and a load connected to said output terminals, whereby when the magnitude of the input signal is such that one core is driven into negative saturation while the other core is prevented from resetting, maximum output is obtained.

9. A high speed magnetic amplifier having a pair of saturable reactors each having a high permeable core of magnetizable material and with a signal and a power winding thereon, said signal windings being connected in series opposition, said power windings being connected in series opposition, a source of power voltage excitation, a rectifier connected between each side of said source of power voltage excitation and said power windings with the polarities of said rectifiers aiding, a pair of rectifiers serially connected to said signal windings with the polarities of said rectifiers aiding and having an electrical midpoint, input terminals provided at said electrical midpoint of said pair of rectifiers and an electrical mid-point of said signal windings, output terminals provided at an electrical mid-point of said source of power voltage excitation and an electrical mid-point of said power windings, and a modulated alternating voltage connected to said input terminals.

References Cited in the file of this patent

Publications: NRL Report 4205, "Fast Response with Magnetic Amplifiers," by D. G. Scorgie, July 29, 1953, published by Naval Research Laboratory, Washington, D. C.; Electrical Engineering, September 1953, "Magnetic Amplifier Circuits," by R. A. Ramey.